United States Patent [19]

Yuh et al.

[11] Patent Number: 5,590,085
[45] Date of Patent: Dec. 31, 1996

[54] COLUMN REDUNDANCY DEVICE FOR SEMICONDUCTOR MEMORY

[75] Inventors: Jong H. Yuh; Jong G. Nam, both of Kyoungki-do, Rep. of Korea

[73] Assignee: Hyundai Electronics Industries Co., Ltd., Rep. of Korea

[21] Appl. No.: 475,863

[22] Filed: Jun. 7, 1995

[30] Foreign Application Priority Data

Jun. 8, 1994 [KR] Rep. of Korea ............... 94-12824

[51] Int. Cl.$^6$ ............... G11C 7/00; G11C 8/00
[52] U.S. Cl. ............ 365/230.03; 365/200; 365/203; 365/222; 365/225.7
[58] Field of Search ............... 365/200, 225.7, 365/230.03, 203, 222

[56] References Cited

U.S. PATENT DOCUMENTS 4,389,715  6/1983  Eaton, Jr. et al. ............... 365/200

*Primary Examiner*—David C. Nelms
*Assistant Examiner*—Trong Phan
*Attorney, Agent, or Firm*—Merchant, Gould, Smith, Edell, Welter & Schmidt

[57] ABSTRACT

A column redundancy device for a semiconductor memory comprising a first fuse box for determining in response to a first row address signal whether a desired number of a plurality of cell array blocks are selected, a second fuse box for determining in response to a second row address signal and a first column address signal and an output signal from the first fuse box whether any one of the desired number of cell array blocks is selected, and a third fuse box for determining in response to a second column address signal and an output signal from the second fuse box whether any one of bit lines in the cell array block selected by one of the second row address signal and the first column address signal and the first row address signal is addressed and selectively driving any one of memory cells included in a redundancy cell array in accordance with the determined result.

3 Claims, 4 Drawing Sheets

COLUMN REDUNDANCY DEVICE FOR SEMICONDUCTOR MEMORY

BACKGROUND OF THE INVENTION

1. Field of the Invention

The present invention relates in general to column redundancy devices for repairing failure memory cells in semiconductor memories, and more particularly to a column redundancy device for a semiconductor memory which is capable of preventing a reduction in a repairing efficiency of failure memory cells although a refresh speed of the semiconductor memory is increased.

2. Description of the Prior Art

For convenience' sake, a semiconductor memory structure and a memory cell selection (addressing) method will first be described with reference to, for example, 16-Mega dynamic random access memory (referred to hereinafter as DRAM) which is presently on the market.

In order to assure stability in operation, the 16-Mega DRAM is partitioned into 4 memory blocks, each of which includes 16 cell array blocks. Each of the cell array blocks includes 256 K memory cells connected in a matrix form to 256 word lines and 1 K bit lines. In result, the 16-Mega DRAM comprises 64 cell array blocks constituting the 4 memory blocks.

The 4 memory blocks are discriminated according to high-order 2 bits AYA and AYB of a 12-bit column address signal AYO–AYB. The 16 cell array blocks of each of the 4 memory blocks are discriminated according to high-order 4 bits AX8–AXB of a 12 bit row address signal AXO–AXB. The low-order 8 bits AXO–AX7 of the 12-bit row address signal AXO–AXB are used to select the 256 word lines included in each of the cell array blocks. The low-order 10 bits AYO–AY9 of the 12-bit column address signal AYO–AYB are used to select the 1K bit lines included in each of the cell array blocks. The ninth and tenth bits AY8 and AY9 of the 12-bit column address signal AYO–AYB are also used to select data read and write paths of the semiconductor memory. Namely, the ninth and tenth column address signal bits AY8 and AY9 are used to selectively connect a data input/output unit to any one of the 4 memory blocks.

In a read operation under the condition that the 16-Mega DRAM has a 16-bit data access mode and a 4K refresh rate, 16-bit data are selected according to the 12 row address signal bits AXO AXB and the 10 column address signal bits AYO–AY9. The selected 16-bit data are transferred to the input/output unit through a data path selected by the ninth and tenth column address signal bits AY8 and AY9. The input/output unit outputs the inputted 16-bit data to an external circuit. In the read operation under the condition that the 16-Mega DRAM has the 16-bit data access mode and a 1K refresh rate, 16-bit data are selected according to the 10 row address signal bits AXO–AX9 and the 10 column address signal bits AYO–AY9. The selected 16-bit data are transferred to the input/output unit through the data path selected by the ninth and tenth column address signal bits AY8 and AY9. The input/output unit outputs the inputted 16-bit data to the external circuit. Here, a data access characteristic of the semiconductor memory is the number of data which can read and written from/into the semiconductor memory at a time.

The high-order 2 bits AXA and AXB of the 12-bit row address signal AXO–AXB are selectively used according to the refresh rate of the semiconductor memory as mentioned above. The high-order 2 row address signal bits AXA and AXB are under a don't care condition if they are not used to select the cell array blocks.

Generally, a column redundancy device is used in the semiconductor memory to repair a failed one of the memory cells in the cell array blocks. The column redundancy device is adapted to drive a redundancy bit line to which a redundancy memory cell is connected, instead of the normal bit line to which the failure memory cell is connected. To this end, the column redundancy device checks a logic value of an address signal from an address source to determine whether the failure memory cell is addressed by the address signal. If it is determined that the failure memory cell is addressed by the address signal, the column redundancy device enables the redundancy bit line to which the redundancy memory cell is connected, while disabling the normal bit line to which the failure memory cell is connected. To determine whether the failure memory cell is addressed by the address signal, the column redundancy device comprises fuses which may be cut by a manufacturer and MOS transistors which are driven in response to an address decoding signal.

However, in such a conventional column redundancy device for the semiconductor memory, when a few high-order bits of the address signal are not used with an increase in the refresh rate, the fuses connected to the unused address signal bits are unconditionally cut. For this reason, in the case where a few high-order bits of the address signal are not used, the redundancy memory cells are unnecessarily consumed, resulting in a reduction in a repairing efficiency of the failure memory cells. The problem with the above-mentioned conventional column redundancy device for the semiconductor memory will hereinafter be described in detail with reference to FIG. 1.

Referring to FIG. 1, there is shown a circuit diagram of the conventional column redundancy device for the semiconductor memory. As shown in this drawing, the conventional column redundancy device comprises a precharge PMOS transistor MP1 connected between a supply voltage source Vcc and a node 11, and a row fuse box 10 connected to the node 11. The precharge PMOS transistor MP1 has a gate for inputting a precharge control signal PRE. When the precharge control signal PRE is low in logic, the precharge PMOS transistor MP1 is turned on to transfer a supply voltage from the supply voltage source Vcc to the node 11. As a result, the supply voltage from the supply voltage source Vcc is maintained on the node 11.

The row fuse box 10 is driven in response to row address combination signals RA89, RA/89, RA8/9, RA/8/9, RAAB, RA/AB, RAA/B and RA/A/B with different logic values to determine whether any one of the 16 cell array blocks to be repaired is addressed in each of the 4 memory blocks. To this end, the row fuse box 10 includes eight fuzes Fr1–Fr8 connected in parallel between the node 11 and a ground voltage source Vss, and eight NMOS transistors Mr1–Mr8, each of which is connected between a corresponding one of the fuzes Fr1–Fr8 and the ground voltage source Vss.

The eight fuzes Fr1–Fr8 may be selectively cut and programmed by the manufacturer. As being programmed, seven of the eight fuzes Fr1–Fr8 may be cut except only one.

The eight NMOS transistors Mr1–Mr8 have gates for inputting the row address combination signals RA89, RA/89, RA8/9, RA/8/9, RAAB, RA/AB, RAA/B and RA/A/B, respectively. The NMOS transistors connected to the cut fuses have no effect on the voltage on the node 11. On the other hand, the NMOS transistor Mri connected to the uncut fuse is selectively driven in response to the logic state of the corresponding row address combination signal to bypass the voltage on the node 11 to the ground voltage source Vss.

For example, assume that seven Fr2–Fr8 of the eight fuzes Fr1–Fr8 are cut and only the remaining one fuse Fr1 is operable. In this case, the NMOS transistor Mr1 is turned on when the row address combination signal RA89 is high in logic. As being turned on, the NMOS transistor Mr1 bypasses the voltage precharged on the node 11 to the ground voltage source Vss. At this time, a low logic signal with a ground voltage from the ground voltage source Vss is generated on the node 11. The low logic signal on the node 11 indicates that a cell array block corresponding to the row address combination signal RA89 is not selected (addressed).

On the contrary, in the case where the row address combination signal RA89 is low in logic, the NMOS transistor Mr1 is turned off to block a current path between the fuse Fr1 and the ground voltage source Vss. As a result, a high logic signal with the precharged voltage is generated on the node 11. The high logic signal on the node 11 indicates that the cell array block corresponding to the row address combination signal RA89 is selected (addressed).

The conventional column redundancy device further comprises a first inverter GI1 for buffering and inverting a column path start signal /CS, and a NAND gate GN1 for inputting the first logic signal from the node 11. When the column path start signal inverted by the first inverter GI1 is high in logic, the NAND gate GN1 inverts the first logic signal from the node 11 and generates the resultant second logic signal. On the contrary, when the column path start signal inverted by the first inverter GI1 is low in logic, the NAND gate GN1 generates the second logic signal which is high in logic regardless of a logic state of the first logic signal from the node 11. The second logic signal from the NAND gate GN1 is inverted by a second inverter GI2 and then applied to an output line 13.

The conventional column redundancy device further comprises a column fuse box 12 connected between the output line 13 and the ground voltage source Vss. The column fuse box 12 is driven in response to the column address signal bits AY0, /AY0, AY1, /AY1, ..., AY7 and /AY7 with different logic values to determine whether a bit line connected to a memory cell to be repaired is selected (addressed). To this end, the column fuse box 12 includes sixteen fuses Fc1–Fc16 connected in parallel between the output line 13 and the ground voltage source Vss, and sixteen NMOS transistors Mc1–Mc16, each of which is connected between a corresponding one of the fuses Fc1–Fc16 and the ground voltage source Vss.

The sixteen fuses Fc1–Fc16 may be selectively cut and programmed by the manufacturer to detect a column address of the failure memory cell. As being programmed, fifteen of the sixteen fuses Fc1–Fc16 may be cut except only one.

The sixteen NMOS transistors Mc1–Mc16 have gates for inputting the column address signal bits AY0, /AY0, AY1, /AY1, ..., AY7 and /AY7, respectively. The NMOS transistors connected to the cut fuses have no effect on a voltage on the output line 13. On the other hand, the NMOS transistor connected to the uncut fuse is selectively driven in response to the logic state of the corresponding column address signal bit to bypass the voltage on the output line 13 to the ground voltage source Vss.

In the case where the column address signal has a logic value programmed by the manufacturer, the column fuse box 12 maintains the voltage on the output line 13 as it is. Thus generated on the output line 13 is a column redundancy control signal RDY which is high in logic. On the contrary, in the case where the column address signal has a logic value different from that programmed by the manufacturer, the column fuse box 12 bypasses the voltage on the output line 13 to the ground voltage source Vss. As a result, the column redundancy control signal RDY generated on the output line 13 goes low in logic. When being high in logic, the column redundancy control signal RDY from the output line 13 drives a redundancy bit line connected to a redundancy memory cell (not shown).

The row address combination signals RA89, RA/89, RA8/9, RA/8/9, RAAB, RA/AB, RAA/B and RA/A/B are produced by selectively combining the high-order 4 bits AX8–AXB of the 12-bit row address signal AX0–AXB. In this connection, the row fuse box 10 is driven in response to the high-order 4 bits AX8–AXB of the 12-bit row address signal AX0–AXB to determine whether any one of the 16 cell array blocks is selected in each of the 4 memory blocks.

However, when the refresh speed is enhanced from 4K cycle to 1K cycle, the high-order one or more bits of the 12-bit row address signal AX0–AXB are under the don't care condition so that they are not used to select the cell array blocks. For this reason, the fuses connected to the unused row address signal bits must be unconditionally cut. Also, the addressing is simultaneously performed with respect to the cell array blocks corresponding to the number of logic values deducible from the unused row address signal bits. As a result, three redundancy memory cells are unnecessarily consumed in repairing one failure memory cell. The unnecessary consumption of the redundancy memory cells results in the reduction in the repairing efficiency of the failure memory cells with the increase in the refresh speed of the semiconductor memory.

SUMMARY OF THE INVENTION

Therefore, the present invention has been made in view of the above problem, and it is an object of the present invention to provide a column redundancy device for a semiconductor memory which is capable of efficiently repairing failure memory cells although a refresh speed of the semiconductor memory is increased.

In accordance with the present invention, the above and other objects can be accomplished by a provision of a column redundancy device for a semiconductor memory having at least two memory blocks, each of the at least two memory blocks including a plurality of cell array blocks and a redundancy cell array, and input/output means for performing bidirectional data transmission with the at least two memory blocks. The column redundancy device comprises address input means for inputting a first row address signal used to select the cell array blocks regardless of a refresh speed of the semiconductor memory, a second row address signal selectively used to select the cell array blocks according to the refresh speed of the semiconductor memory, a first column address signal used to select one of the at least two memory blocks to be connected to the input/output means, and a second column address signal used to select bit lines included in the cell array blocks. The column redundancy device further comprises block programming means for determining in response to the first row address signal whether a desired number of the plurality of cell array blocks are selected; auxiliary block programming means for determining in response to one of the second row address signal and the first column address signal and an output signal from the block programming means whether any one of the desired number of cell array blocks is selected; and column programming means for determining in response to the second column address signal and an output signal from the auxiliary block programming means whether any one of the bit lines in the cell array block selected by the one of the second row address signal and the first column address signal and the first row address signal is addressed and selectively driving any one of memory cells included in the redundancy cell array in accordance with the determined result.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

For the convenience of description, assume that a semiconductor memory is partitioned into 4 memory blocks, each of which includes 16 cell array blocks. It is also assumed that the semiconductor memory has a refresh speed of 1K cycle or 4K cycle. A column redundancy device of the present invention will hereinafter be described while being applied to the above two cases where the semiconductor memory has the refresh speed of 1K cycle and the refresh speed of 4K cycle.

Figure 2:
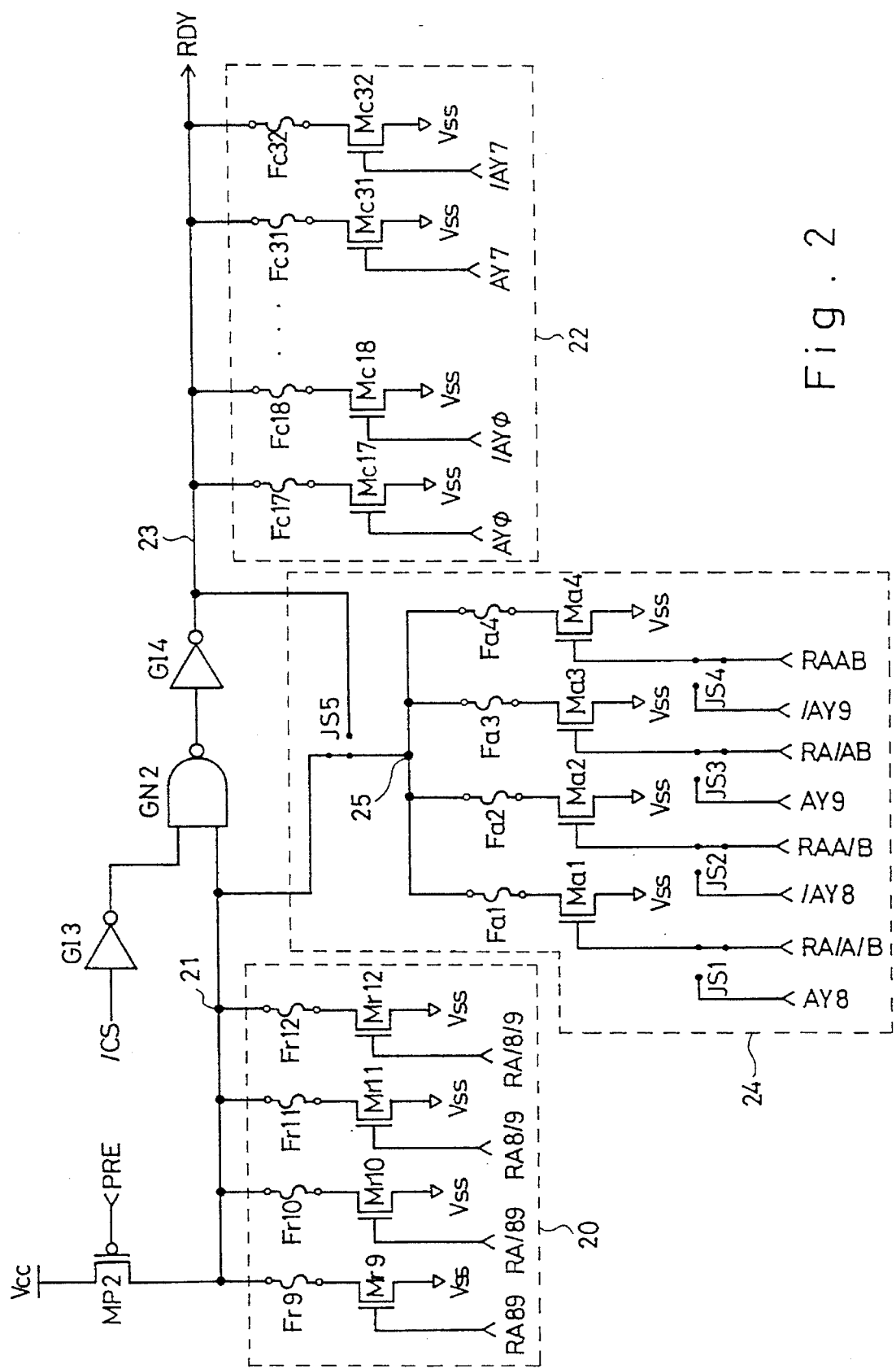
FIG. 2 is a circuit diagram of a column redundancy device for a semiconductor memory in accordance with the present invention.

Referring to FIG. 2, there is shown a circuit diagram of the column redundancy device for the semiconductor memory in accordance with the present invention. As shown in this drawing, the column redundancy device comprises a precharge PMOS transistor MP2 connected between a supply voltage source Vcc and a first node 21, and a row fuse box 20 connected to the first node 21. The precharge PMOS transistor MP2 has a gate for inputting a precharge control signal PRE. When the precharge control signal PRE is low in logic, the precharge PMOS transistor MP2 is turned on to transfer a supply voltage from the supply voltage source Vcc to the first node 21. As a result, the supply voltage from the supply voltage source Vcc is maintained on the first node 21.

The row fuse box 20 is driven in response to row address combination signals RA89, RA/89, RA8/9 and RA/8/9 with different logic values to determine whether any one of the 16 cell array blocks to be repaired is addressed in each of the 4 memory blocks. To this end, the row fuse box 20 includes four fuses Fr9–Fr12 connected in parallel between the first node 21 and a ground voltage source Vss, and four NMOS transistors Mr9–Mr12, each of which is connected between a corresponding one of the fuzes Fr9–Fr12 and the ground voltage source Vss.

The four fuzes Fr9–Fr12 may be selectively cut and programmed by the manufacturer to simultaneously select four of the 16 cell array blocks in each of the 4 memory blocks. As being programmed, three of the four fuzes Fr9–Fr12 may be cut except only one.

The four NMOS transistors Mr9–Mr12 have gates for inputting the row address combination signals RA89, RA/89, RA8/9 and RA/8/9, respectively. The NMOS transistors connected to the cut fuses have no effect on the voltage on the first node 21. On the other hand, the NMOS transistor connected to the uncut fuse is selectively driven in response to the logic state of the corresponding row address combination signal to bypass the voltage on the first node 21 to the ground voltage source Vss.

For example, assume that three Fr10–Fr12 of the four fuzes Fr9–Fr12 are cut and only the remaining one fuse Fr9 is operable. In this case, the NMOS transistor Mr9 is turned on when the row address combination signal RA89 is high in logic. As being turned on, the NMOS transistor Mr9 bypasses the voltage precharged on the first node 21 to the ground voltage source Vss. At this time, a low logic signal with a ground voltage from the ground voltage source Vss is generated on the first node 21. The low logic signal on the first node 21 indicates that the four cell array blocks corresponding to the row address combination signal RA89 are not selected (addressed).

On the contrary, in the case where the row address combination signal RA89 is low in logic, the NMOS transistor Mr9 is turned off to block a current path between the fuse Fr9 and the ground voltage source Vss. As a result, a high logic signal with the precharged voltage is generated on the first node 21. The high logic signal on the first node 21 indicates that the four cell array blocks corresponding to the row address combination signal RA89 are selected (addressed).

The column redundancy device further comprises a first inverter G13 for buffering and inverting a column path start signal /CS, and a NAND gate GN2 for inputting the first logic signal from the first node 21. When the column path start signal inverted by the first inverter G13 is high in logic, the NAND gate GN2 inverts the first logic signal from the first node 21 and generates the resultant second logic signal. On the contrary, when the column path start signal inverted by the first inverter G13 is low in logic, the NAND gate GN2 generates the second logic signal which is high in logic regardless of a logic state of the first logic signal from the first node 21. The second logic signal from the NAND gate GN2 is inverted by a second inverter GI4 and then applied to an output line 23.

The column redundancy device further comprises a column fuse box 22 connected between the output line 23 and the ground voltage source Vss. The column fuse box 22 is driven in response to column address signal bits AY0, /AY0, AY1, /AY1, ..., AY7 and /AY7 with different logic values to determine whether a bit line connected to a memory cell to be repaired is selected (addressed). To this and, the column fuse box 22 includes sixteen fuzes Fc17–Fc32 connected in parallel between the output line 23 and the ground voltage source Vss, and sixteen NMOS transistors Mc17–Mc32, each of which is connected between a corresponding one of the fuses Fc17–Fc32 and the ground voltage source Vss.

The sixteen fuses Fc17–Fc32 may be selectively cut and programmed by the manufacturer to detect a column address of the failure memory cell. As being programmed, fifteen of the sixteen fuzes Fc17–Fc32 may be cut except only one.

Figure 1:
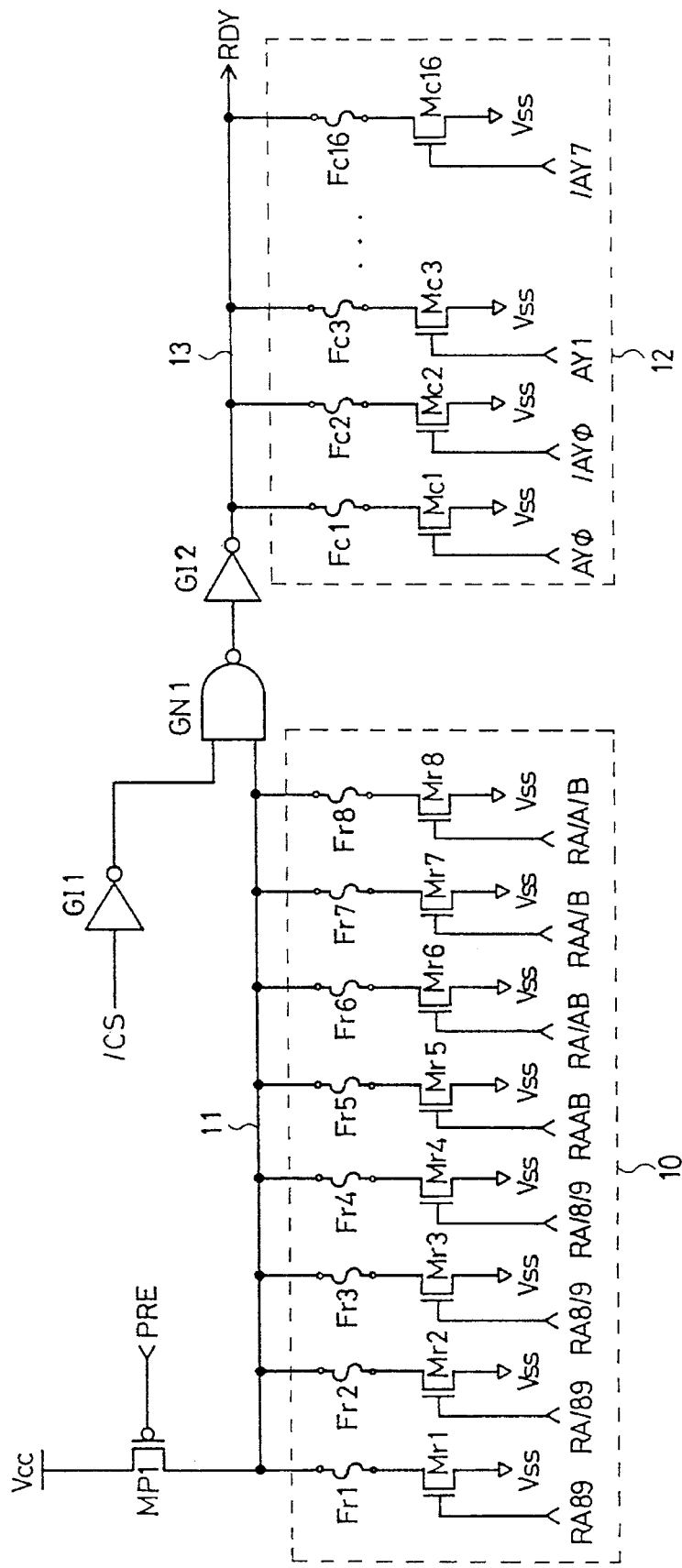
FIG. 1 is a circuit diagram of a conventional column redundancy device for a semiconductor memory.

The sixteen NMOS transistors Mc17–Mc32 have gates for inputting the column address signal bits AY0, /AY0, AY1, /AY1, . . . , AY7 and /AY7, respectively. The column fuse box 22 with the sixteen fuzes Fc17–Fc32 and the sixteen NMOS transistors Mc17–Mc32 is the same in operation as the column fuse box 12 in FIG. 1 and details thereof will thus be omitted.

The column redundancy device further comprises an auxiliary fuse box 24 selectively connected to the first node 21 and the output line 23. The auxiliary fuse box 24 selectively inputs row address combination signals RA/A/B, RAA/B, RA/AB and RAAB and column address signal bits AY8, /AY9 and /AY9. Upon inputting the row address combination signals RA/A/B, RAA/B, RA/AB and RAAB, the auxiliary fuse box 24 cooperates with the row fuse box 20 to select any one of the 16 cell array blocks in each of the 4 memory blocks. On the other hand, upon inputting the column address signal bits AY8, /AY8, AY9 and /AY9, the auxiliary fuse box 24 is adapted to select any one of the four cell array blocks selected by the row fuse box 20.

The auxiliary fuse box 24 includes four fuzes Fa1–Fa4 connected in parallel between a second node 25 and the ground voltage source Vss, and four NMOS transistors Ma1–Ma4, each of which is connected between a corresponding one of the fuzes Fa1–Fa4 and the ground voltage source Vss. First to fourth junction switches JS1–JS4 are connected to gates of the four NMOS transistors Ma1–Ma4, respectively.

The first to fourth junction switches JS1–JS4 are set by the manufacturer in the manufacturing process to select the row address combination signals RA/A/B, RAA/B, RA/AB and RAAB or the column address signal bits AY8, /AY8, AY9 and /AY9, respectively. In the case where the semiconductor memory has the refresh speed of 1K cycle, the first to fourth junction switches JS1–JS4 are set to transfer the column address signal bits AY8, /AY8, AY9 and /AY9 to the gates of the four NMOS transistors Ma1–Ma4, respectively. On the other hand, in the case where the semiconductor memory has the refresh speed of 4K cycle, the first to fourth junction switches JS1–JS4 are set to transfer the row address combination signals RA/A/B, RAA/B, RA/AB and RAAB to the gates of the four NMOS transistors Ma1–Ma4, respectively.

The auxiliary fuse box 24 further includes a fifth junction switch JS5 for selectively connecting the second node 25 to the first node 21 and the output line 23. In the case where the semiconductor memory has the refresh speed of 1K cycle, the fifth junction switch JS5 connects the second node 25 to the output line 23. On other hand, in the case where the semiconductor memory has the refresh speed of 4K cycle, the fifth junction switch JS5 connects the second node 25 to the first node 21.

In the case where the semiconductor memory has the refresh speed of 4K cycle, the four fuzes Fa1–Fa4 are programmed by the manufacturer to select any one of the four cell array blocks selected by the row fuse box 20. In this case, three of the four fuzes Fa1–Fa4 may be cut except only one.

In the case where the semiconductor memory has the refresh speed of 1K cycle, the four fuzes Fa1–Fa4 are programmed in cooperation with the four fuzes Fr9–Fr12 in the row fuse box 20 by the manufacturer to select any one of the 16 cell array blocks in each of the 4 memory blocks. If only one of the four fuzes Fr9–Fr12 in the row fuse box 20 is not cut, all the four fuzes Fa1–Fa4 are cut. On the other hand. If all the four fuzes Fr9–Fr12 in the row fuse box 20 are cut, only one of the four fuzes Fa1–Fa4 is not cut.

In the case where the semiconductor memory has the refresh speed of 4K cycle, the four NMOS transistors Ma1–Ma4 are driven in response to the row address combination signals RA/A/B, RAA/B, RA/AB and RAAB from the first to fourth junction switches JS1–JS4, respectively. In this case, the NMOS transistors Ma connected to the cut fuses Fa have no effect on voltages on the first and second nodes 21 and 25.

The NMOS transistor Ma connected to the uncut fuse Fa is selectively driven in response to the logic state of the corresponding row address combination signal. Namely, when the corresponding row address combination signal is high in logic, the NMOS transistor Ma connected to the uncut fuse Fa is turned on to bypass a voltage, which is supplied from the first node 21 to the second node 25 through the fifth junction switch JS5, to the ground voltage source Vss. At this time, the first logic signal on the first node 21 becomes low in logic because it has the ground voltage from the ground voltage source Vss. The low logic signal on the first node 21 indicates that any one of the 16 cell array blocks in each of the 4 memory blocks are not selected (addressed).

On the other hand, when the corresponding row address combination signal is low in logic, the NMOS transistor Ma connected to the uncut fuse Fa is turned off to block a current path of the voltage which is supplied from the first node 21 to the second node 25 through the fifth junction switch JS5. At this time, the first logic signal on the first node 21 becomes high in logic because it has the precharged voltage Vcc. The high logic signal on the first node 21 indicates that any one of the 16 cell array blocks corresponding to the row address combination signal is selected in each of the 4 memory blocks.

In the case where the semiconductor memory has the refresh speed of 1K cycle, the four NMOS transistors Ma1–Ma4 are driven in response to the column address signal bits AY8, /AY8, AY9 and /AY9 from the first to fourth junction switches JS1–JS4, respectively. In this case, the NMOS transistors Ma connected to the cut fuses Pa have no effect on voltages on the second node 25 and the output line 23.

The NMOS transistor Ma connected to the uncut fuse Pa is selectively driven in response to the logic state of the corresponding column address signal bit. Namely, when the corresponding column address signal bit is high in logic, the NMOS transistor Ma connected to the uncut fuse Pa is turned on to bypass a voltage, which is supplied from the output line 23 to the second node 25 through the fifth junction switch JS5, to the ground voltage source Vss. At this time, the column redundancy control signal RDY on the output line 23 becomes low in logic because it has the ground voltage from the ground voltage source Vss. The low logic column redundancy control signal RDY on the output line 23 indicates that any one of the four cell array blocks selected by the row fuse box 20 is not selected (addressed).

On the other hand, when the corresponding column address signal bit is low in logic, the NMOS transistor Ma connected to the uncut fuse Pa is turned off to block a current path of the voltage which is supplied from the output line 23 to the second node 25 through the fifth junction switch JS5. At this time, the column redundancy control signal RDY on the output line 23 becomes high in logic because it has the precharged voltage Vcc. The high logic column redundancy control signal RDY on the output line 23 indicates that any one of the four cell array blocks selected by the row fuse box 20 is selected (addressed).

The row address combination signals RA89, RA/89, RA8/9 and RA/8/9 supplied to the row fuse box 20 are produced by combining the row address signal bits AX8 and AX9 which are always used for the block selection regardless of the refresh speed (1K cycle or 4K cycle) of the semiconductor memory.

The row address combination signals RA/A/B, RAA/B, RA/AB and RAAB supplied to the auxiliary fuse box 24 are produced by combining the row address signal bits AXA and AXB which are used for the block selection when the semiconductor memory has the refresh speed of 1K cycle.

The column address signal bits AY8, /AY8, AY9 and /AY9 supplied to the auxiliary fuse box 24 are used to selectively connect the four memory blocks to an input/output unit.

Figure 3:
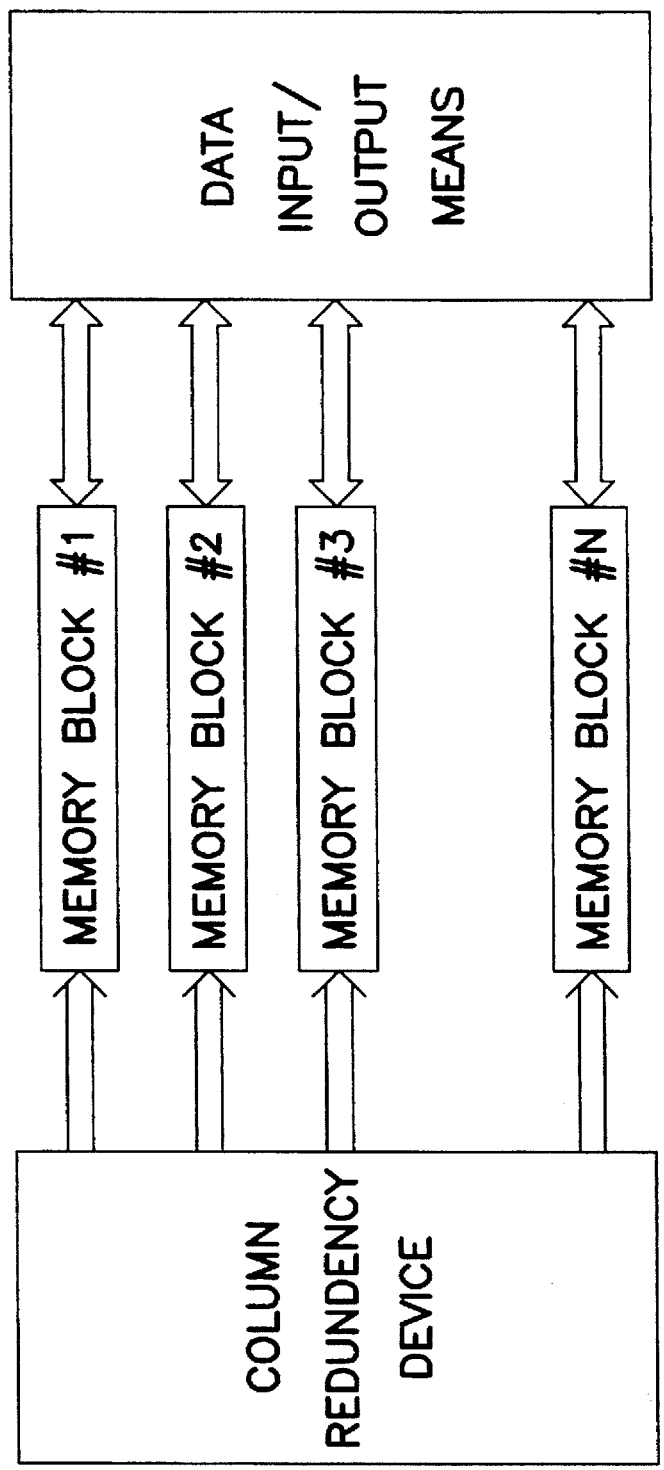
FIG. 3 is a block diagram of the column redundancy device interconnecting with conventional memory blocks and data input/output means.
Figure 4:
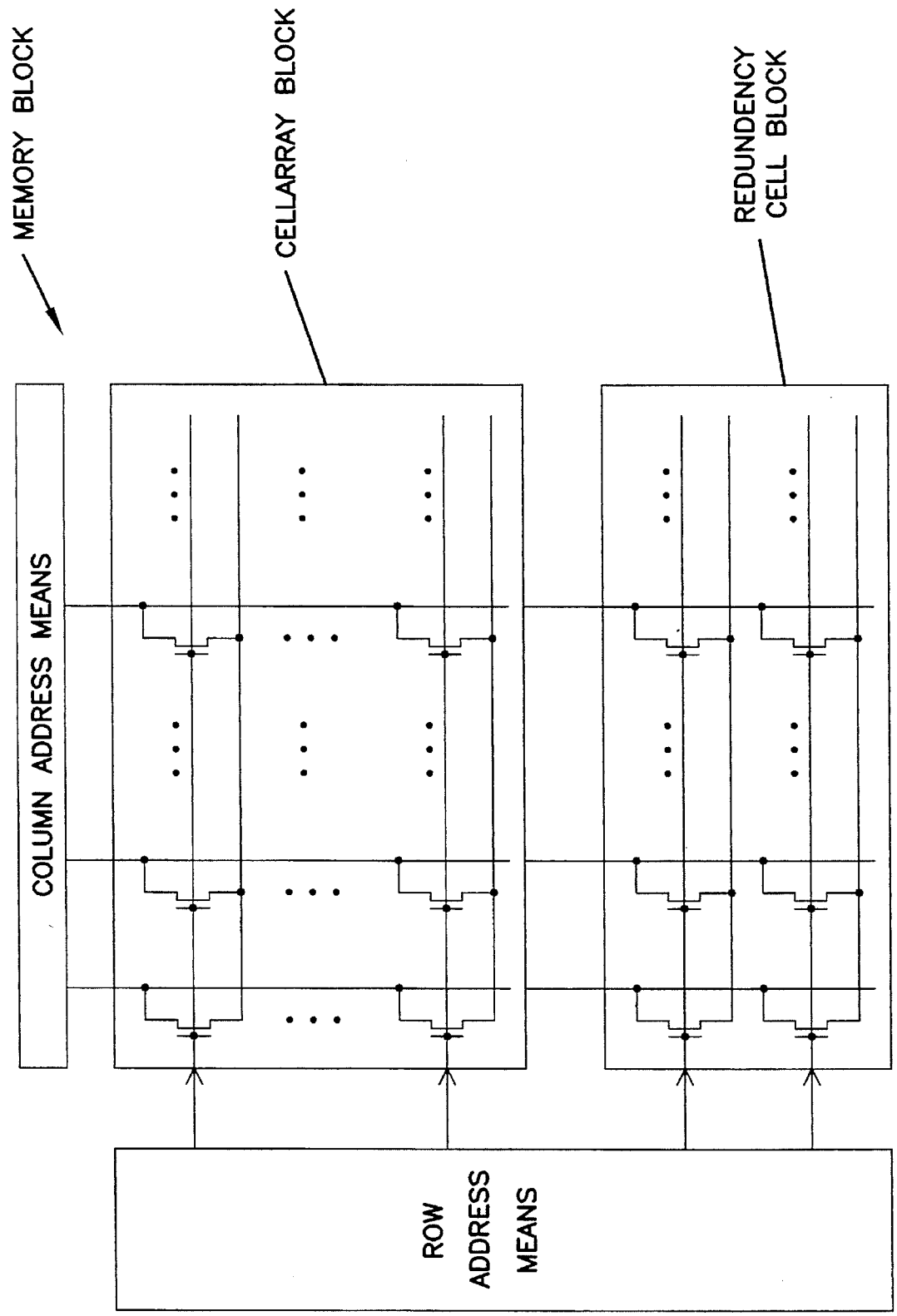
FIG. 4 is a schematic diagram of the conventional memory blocks.

As apparent from the above description and generally shown in FIGS. 3 and 4, according to the present invention, the cell array blocks constituting the memory blocks 1 . . . n can be respectively selected using the column address signal bits which select the input/output paths of the memory blocks, instead of the row address signal bits for the block selection which are not used as the refresh speed of the semiconductor memory is increased. For this reason, the column redundancy device of the present invention is capable of preventing the unnecessary consumption of the redundancy memory cells due to the increase in the refresh speed of the semiconductor memory. Therefore, the column redundancy device of the present invention has the effect of preventing the reduction in the repairing efficiency of the failure memory cells although the refresh speed of the semiconductor memory is increased.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. In a semiconductor memory having at least two memory blocks, each of said at least two memory blocks including a plurality of cell array blocks and a redundancy cell array, and input/output means for performing bidirectional data transmission with said at least two memory blocks, a column redundancy device comprising:

address input means for inputting a first row address signal used to select said cell array blocks regardless of a refresh speed of said semiconductor memory, a second row address signal selectively used to select said cell array blocks according to the refresh speed of said semiconductor memory, a first column address signal used to select one of said at least two memory blocks to be connected to said input/output means, and a second column address signal used to select bit lines included in said cell array blocks;

block programming means for determining in response to said first row address signal whether a desired number of said plurality of cell array blocks are selected;

auxiliary block programming means for determining in response to one of said second row address signal and said first column address signal and an output signal from said block programming means whether any one of said desired number of cell array blocks is selected; and column programming means for determining in response to said second column address signal and an output signal from said auxiliary block programming means whether any one of said bit lines in said cell array block selected by said one of said second row address signal and said first column address signal and said first row address signal is addressed and selectively driving any one of memory cells included in said redundancy cell array in accordance with the determined result.

2. A column redundancy device as set forth in claim 1, wherein said auxiliary block programming means includes switching means set by a manufacturer to select said one of said second row address signal and said first column address signal.

3. A column redundancy device as set forth in claim 2, wherein said switching means is set to input said first column address signal when the refresh speed of said semiconductor memory is high and to input said second row address signal when the refresh speed of said semiconductor memory is low.

* * * * *